(12) United States Patent
Chou et al.

(10) Patent No.: US 7,768,104 B2
(45) Date of Patent: Aug. 3, 2010

(54) APPARATUS AND METHOD FOR SERIES CONNECTION OF TWO DIE OR CHIPS IN SINGLE ELECTRONICS PACKAGE

(75) Inventors: Ta-Te Chou, Taipei (TW); Hui-Ying Ding, Tianjin (CN); Yun Zhang, Tianjin (CN); Hong-Yun He, Tianjin (CN); Li-Zhu Hao, Tianjin (CN)

(73) Assignee: Vishay General Semiconductor, Inc., Melville, NY (US)

( * ) Notice: Subject to any disclaimer, the term of this patent is extended or adjusted under 35 U.S.C. 154(b) by 233 days.

(21) Appl. No.: 12/050,592

(22) Filed: Mar. 18, 2008

(65) Prior Publication Data

US 2009/0236705 A1   Sep. 24, 2009

(51) Int. Cl.
    *H01L 23/495*    (2006.01)
(52) U.S. Cl. .............................. 257/675; 257/E21.499; 257/E23.031; 438/107
(58) Field of Classification Search ................. 257/675, 257/E21.499, E23.031; 438/107
    See application file for complete search history.

(56) References Cited

U.S. PATENT DOCUMENTS

| 6,740,902 | B2 * | 5/2004 | Oliver et al. | 257/81 |
| 6,975,023 | B2 * | 12/2005 | Oliver et al. | 257/676 |
| 2004/0041230 | A1 | 3/2004 | Oliver et al. | |
| 2005/0280125 | A1 | 12/2005 | Oliver et al. | |

FOREIGN PATENT DOCUMENTS

JP   55 130135   10/1980
JP   08 186217    7/1996

OTHER PUBLICATIONS

Search Report for co-pending PCT/US2008/058816 listing relevant art cited by the International Searching Authority.

* cited by examiner

*Primary Examiner*—Trung Dang
(74) *Attorney, Agent, or Firm*—Volpe and Koenig, P.C.

(57) ABSTRACT

An apparatus and method for a two semiconductor device package where the semiconductor devices are connected in electrical series. The first device is mounted P-side down on an electrically conductive substrate. Non-active area on the P side is isolated from the electrically conductive substrate. The second device is mounted P-side up at a spaced apart location on the substrate. Opposite sides of each are electrically connected to leads to complete the series connection of the two devices. A method of manufacturing such a package includes providing an electrically conductive lead frame, mounting one device P-side up and flipping the other device and mounting it P-side down on the lead frame with non-active area of the P side isolated from the lead frame, and connecting the other side of each device to separate leads. Isolation of the non-active area of the P side of the device can be through modification of the substrate or lead frame surface by grooves or raised portions. Alternatively, it can be by adding an electrically isolating coating on the non-active area of the P-side of a semiconductor device to allow it to be mounted P side down on an electrically conductive substrate or mounting location without modification to the substrate or lead frame.

24 Claims, 9 Drawing Sheets

APPARATUS AND METHOD FOR SERIES CONNECTION OF TWO DIE OR CHIPS IN SINGLE ELECTRONICS PACKAGE

I. BACKGROUND OF THE INVENTION

A. Field of the Invention

The present invention relates to electronics packaging of a circuit or one or more components, and in particular, to electronics packaging of plural solid state components on an electrically conductive lead frame or substrate in a single package.

B. State of the Art

A widely used method for manufacturing surface mount or through-pin (socket mount) electronic devices or circuits is to assemble one or more solid state components on a lead frame and then encapsulate the component(s) in a package. This is sometimes referred to in the industry as electronics packaging.

The lead frame is essentially the "skeleton" or framework of the plastic-encapsulated package, providing mechanical support to the solid state component(s) or circuit during its assembly into a finished product. The solid state component typically is a die, sometimes called a chip or a bare chip. The lead frame includes a die paddle to which one or more die is/are attached or mounted and leads which serve as the means for external electrical connection. The die is electrically connected to the leads or terminals by wires or other conductors (e.g. through wire bonding, or tab or clip bonding, or with electrically-conductive bars on a bridge frame).

Plastic package type lead frames are many times made of alloys that meet the following critical properties: good adherence to the molding compound, a coefficient of thermal expansion as close as possible to those of the die and the molding compound, high strength, good formability, and high electrical and thermal conductivities. A copper alloy is one type of material. Multiple lead frames can be mass-produced in an automated fashion in a single flat sheet of metal (e.g. by stamping or etching). After the shape of each lead frame in the sheet is created, they can be singulated into strips of plural lead frames or into individual lead frames. One or more die (e.g. solid state devices) are mounted on each lead frame. This can also be automated. Final assembly includes any needed electrical connections between die and leads, and encapsulation with a plastic material to create a "package" with exposed electrical leads. Automated processes also exist for these conventional steps.

In the specific example of a power factor correction (PFC), continuous conduction mode (CCM) rectifier electronics package for high voltage applications, it is desirable to have fast switching speed, low power dissipation, and high voltage capability. One solution is to use two low voltage diodes in series in one package. As will be discussed below, this can require the addition of a ceramic isolation layer into an existing package and series connection of the two chips internally. However, the ceramic board is expensive and the manufacturing and assembly process is complex. An alternative solution is to use a single SiC or GaAs diode, which has good electrical characteristics. However, such a device needs an even more complicated manufacturing process and has a higher (e.g. three to five times) cost and investment than the tandem series-connected low voltage PFC diodes mentioned previously. Therefore, there is room for improvement in the state of the art.

Figure 1A:
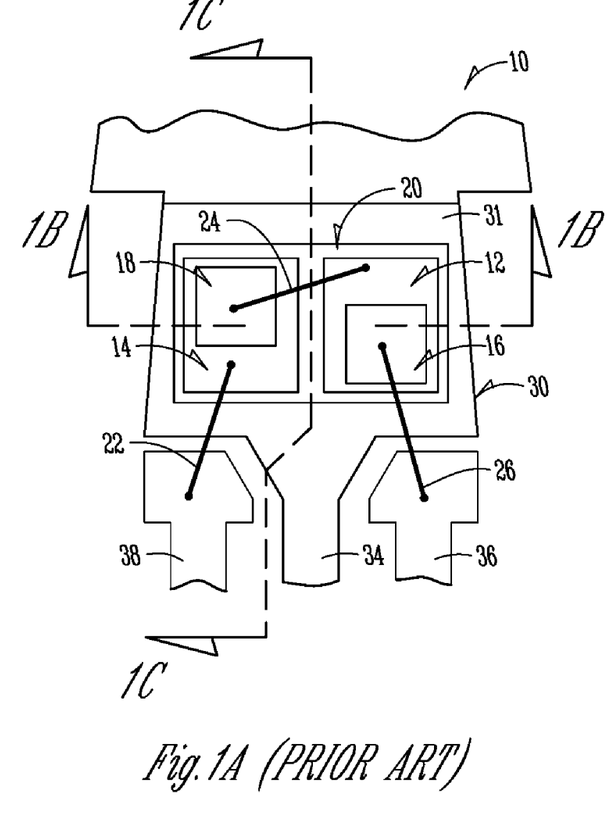
FIG. 1A is a partial top plan view of a state of the art PFC dual or tandem semiconductor rectifier combination mounted on a lead frame, with both diodes P-side up and connected in series by wire bonding.
Figure 1B:
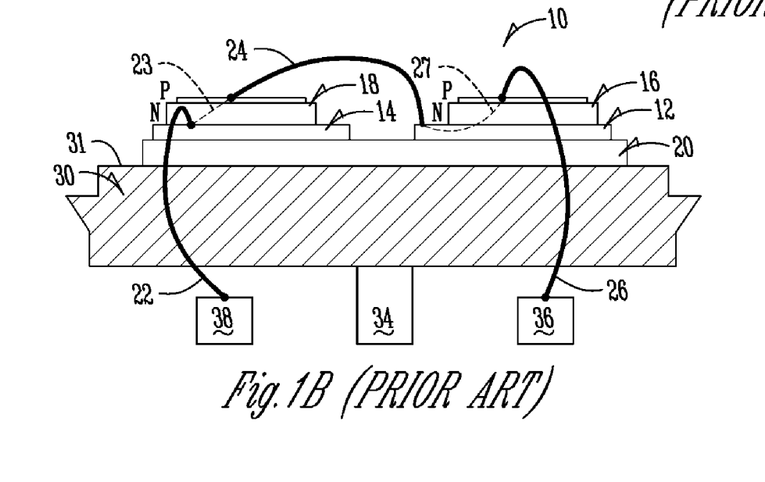
FIG. 1B is an enlarged sectional view taken along line 1B-1B of FIG. 1A.
Figure 1C:
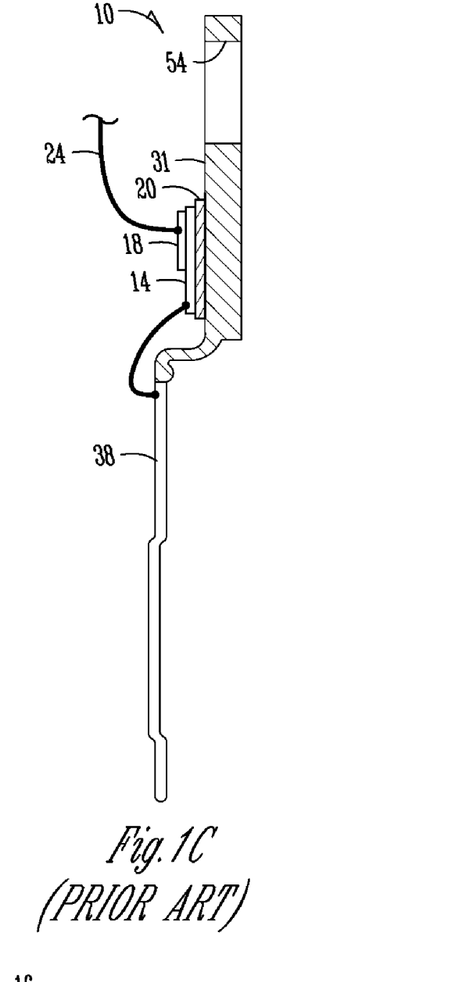
FIG. 1C is a reduced-in-size side plan view of a complete package of FIG. 1A.

FIGS. 1A-C illustrate one state of the art configuration for connecting two low voltage semi-conductor diodes in series in one lead frame package for a high voltage power rectifier. Package 10 includes a lead frame 30 with a die mounting surface 31 on the die paddle, an integrally connected and outwardly extending lead or support 34, and two electrically isolated leads 36 and 38. All parts of lead frame 30 are made of highly electrically conductive material.

To connect die 16 and 18 in series between leads 36 and 38, an isolation board 20, usually made of ceramic, is fixed (e.g. adhered) to mounting surface 31 of the die paddle of lead frame 30. Conduction pads (e.g. of copper) 12 and 14 are fixed (e.g. adhered) to the top surface of isolation board 20 at spaced apart positions. Sometimes one of copper pads 16 or 18 stands out as one lead. The ceramic isolation board requires good heat conduction capability. Die 16 and 18 are attached on copper pads 12 and 14 respectively by a solder joint. Finally, wires 22, 24, and 26 are connected by wire bonding techniques to serially electrically connect leads 36 and 38 to chips 16 and 18 as shown in FIGS. 1A-C. Both die 16 and 18 are P-side up. Mounting surface 31 of die paddle lead frame 30 is essentially flat. Wire bonding is a well-known method of electrical connection of die to lead in microelectronic or semiconductor device fabrication and automated assembly processes.

As indicated in FIGS. 1A-C, each of the semiconductor diodes has a "P" side, region, or block with exposed P-type material (P doped silicon or other semiconductor material), and an "N" side, region or block with exposed N-type semiconductor material (N doped silicon or semiconductor material). Conventionally, each is mounted "P side up" on lead frame die mounting surface 31. For series connection of the two diodes and a lead for each diode, a wire or other conductor must be electrically connected between a first lead and the P side of a first diode and between second lead and the N side of a second diode. Another wire or conductor must be electrically connected between the N diode of the first diode and the P side of the second diode. As diagrammatically illustrated in FIG. 1B, an electrical current path between P and N sides of each diode 16 and 18 (see broken lines 23 and 27 in FIG. 1B) completes the series connection. Through-hole 54 is typically used to connect the lead frame of the package to a heat sink.

Figures 2A, 2B:
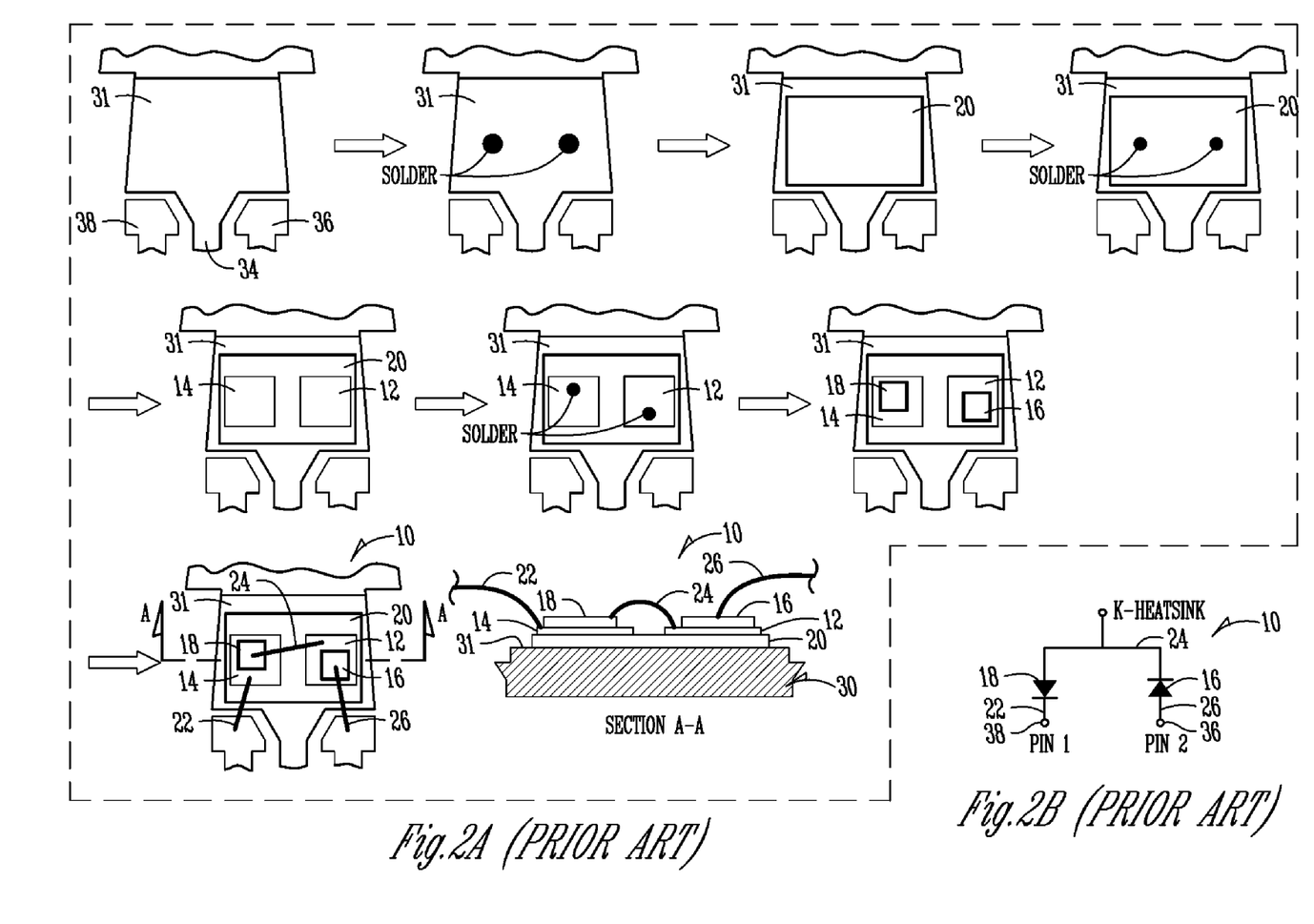
FIG. 2A is a diagrammatic depiction of steps in a manufacturing assembly process for the package of FIGS. 1A-C.
FIG. 2B is an electrical circuit diagram of the package of FIGS. 1A-C and 2A.

FIG. 2A illustrates an exemplary method of manufacturing steps for package 10 of FIGS. 1A-C. As can be seen, this state of the art assembly process requires the addition of several pieces to the lead frame prior to mounting of the die. Specifically, it requires the mounting of ceramic isolation board 20 and copper pads 12 and 14. Also, three wire bonding connections are used; one between lead 38 and copper pad 14 (which essentially is the "N" side of die 18), one between the top or "P" side of die 18 and copper pad 12 (essentially the "N" side of die 16), and one between the top or "P" side of die 16 and lead 36. This results in the series connection shown in schematic form in FIG. 2B. The foregoing package includes multiple parts and steps to create the series-connection tandem diode circuit. Although simpler and cheaper than using one SiC or GaAs diode, this tandem diode assembly process is also relatively complex. The above-described factors increase cost and resources needed to manufacture such circuits and packages. It can be further appreciated, such multiple parts, including isolation board 20, can make it more difficult to maximize performance of the rectifier device (e.g. switching speed and power dissipation). They also can increase the size of the device, which is contrary to desirability to improve density of circuits and decrease package size of devices.

Therefore, a need has been identified to improve over or solve problems and deficiencies in the state of the art. For example, it can be beneficial to reduce the cost of materials, manufacturing, and assembly of such devices and the circuits in which they are used, while at the same time achieving better electrical and physical characteristics for such devices (e.g. thermal transfer, switching performance, size, and power dissipation) and for the circuits in which they are use (e.g. power density).

The housing or packaging which chips typically come in for plugging into (socket mount) or soldering onto (surface mount) a printed circuit board are to protect the packaged chip or chips. But it is not a trivial matter because the electrical characteristics of the electronics must be maintained. Electronics packaging is a large and complicated industry. It is further complicated by continued pressure to provide more and more I/O interconnections to a die (bare chip) that increasingly are shrinking in size. Smaller package sizes are also desirable for miniaturization of, for example, many electronic devices, including the fast expanding number of hand-held devices. But at the same time, it is desirable to minimize manufacturing costs and complexity. Thus, there are a variety of sometimes conflicting factors involved in electronics packaging.

II. BRIEF SUMMARY OF THE INVENTION

In one aspect of the invention, an electronics package comprises an electrically conductive lead frame having a mounting surface, a first semiconductor chip mounted P-side down on the lead frame mounting surface with only P type semiconductor material in electrical communication with the lead frame, a second semiconductor chip mounted P-side up and spaced apart from the first chip on the semi-conductor mounting surface, and electrical conductors operatively connected between the N type semiconductor material of the first chip and one lead of the lead frame and between the P type semiconductor material of the second chip to another lead on the lead frame, so that the diodes are connected in series using the conductivity of the lead frame as a series electrical connection (P side to N side) between diodes.

In another aspect of the invention, a method of manufacturing a series-connected tandem semiconductor package comprises mounting two die on a lead frame surface, one die P-side down and the other P-side up, thus using the lead frame as a series electrical connection between the die. The N-side of the first die and the P-side of the second die are electrically connected to first and second leads, respectively, to connect the die in series to the leads.

Optionally, a die mounting locator is formed in the surface of the lead frame for at least one die. The die mounting locator can comprise recesses or raised bosses which indicate the mounting position for the die and assist confining electrical connection of the die to the lead frame to just the relevant area on mounting side of the die. The die mounting locator can also further electrically isolate any non-active area on the mounting side of the die from the electrically conductive lead frame.

Some semiconductor devices, including diodes, include a non-active area on the P-side of a die. For those types of die, another aspect of the invention comprises covering the non-active area with an electrically isolating material to improve performance, for example switching performance, of the packaged device using the die. Such a die, with its P side non-active area covered with isolation material, can be used with one or both of die of the tandem diode rectifier described earlier, and whether the die is P-side down or up, but particularly when the die is P side down. The die can also be optionally implemented in a lead frame package in combination with a die mounting locator, as described above, formed in the lead frame surface.

III. BRIEF DESCRIPTION OF THE DRAWINGS

A. Prior Art Example

B. First Exemplary Embodiment According to the Invention

C. Second Exemplary Embodiment According to the Invention

D. Third Exemplary Embodiment According to the Invention

IV. DETAILED DESCRIPTION OF EXEMPLARY EMBODIMENTS ACCORDING TO THE INVENTION

A. Overview

For a better understanding of the invention, a detailed description of several examples of different forms the invention can take will now be set forth. Frequent reference will be made to the accompanying Figures, which have been summarized above. Reference numerals will be used to indicate certain parts and locations in the Figures. The same reference numerals will be used to indicate the same or similar parts or locations throughout the Figures unless otherwise indicated.

The exemplary embodiments will be discussed in the context of mounting two semiconductor diodes in series on a lead frame to produce a tandem diode PFC CCM rectifier package. It is to be understood, however, these arrangements and methods can be applied to other semiconductor diodes or even to other semiconductor components in analogous ways.

B. Exemplary Embodiment One

Reference Number 50

Figure 3A:
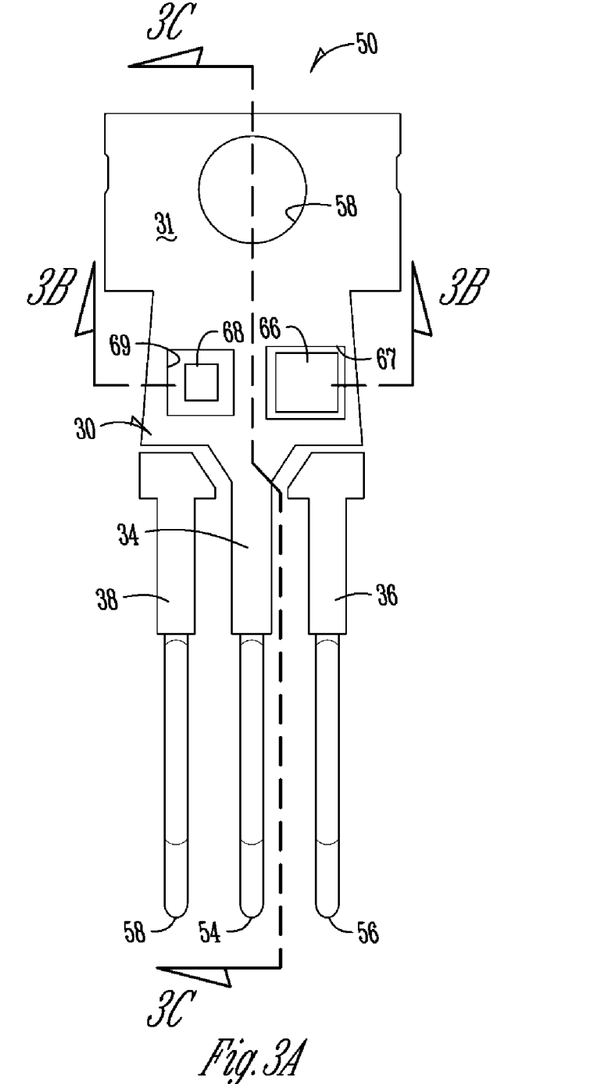
FIG. 3A is a top plan view of a modified lead frame according to a first exemplary embodiment of the present invention.
Figure 3B:
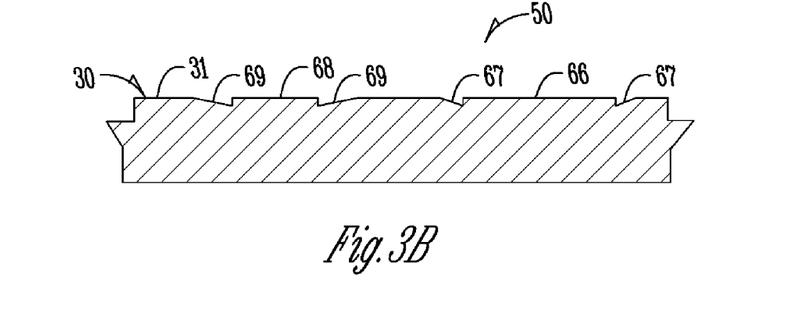
FIG. 3B is an enlarged cross-section taken along line 3B-3B of FIG. 3A.
Figure 3C:
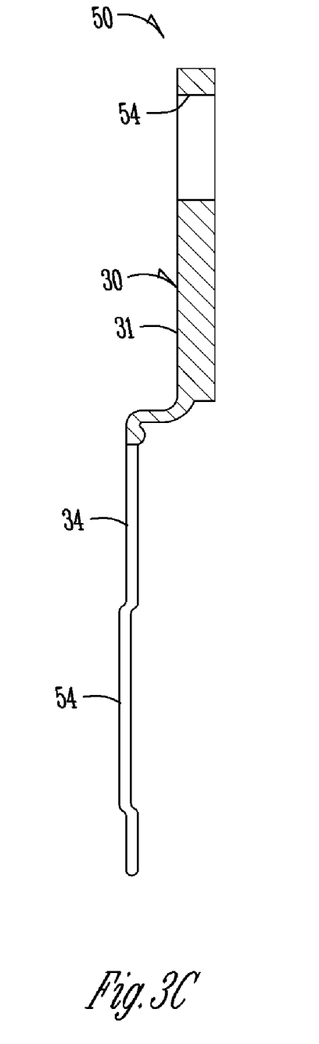
FIG. 3C is a reduced-in-size sectional view taken along line 3C-3C of FIG. 3A.

FIGS. 3A-C, 4A-C, and 5A and B illustrate a first exemplary embodiment 50. Two semi-conductor die or chips 16 and 18; in this example, tandem PFC (power-factor correction) diodes, are mounted on the die paddle of a lead frame 30. FIGS. 3A-C illustrate lead frame 30 in its original form prior to mounting of chips 16 and 18.

Lead frame 30 is an example of a conventional type lead frame for an electronics package, including a power rectifier. It includes a lead frame mounting surface 31 at its die paddle, a directly connected lead or support 34 having a distal end 58, and first and second electrically isolated (spaced apart from the die paddle) leads 36 and 38 with distal ends 56 and 58 respectively. Lead frame 30 has the following primary difference from a conventional lead frame.

Lead frame 30 is modified in this first exemplary embodiment by etching, stamping, cutting, or otherwise forming a groove 69 into surface 31. As shown in FIG. 3B, groove 69 is V-shaped in cross-section. It defines a central die mounting pad or surface 68. Die mounting pad or surface is designed to provide a structural mounting location for die 18. In this embodiment, the top surface area and shape of pad 68 is specifically designed to correlate with the area and shape of exposed P type semiconductor material on the P side of die 18.

Figure 8:
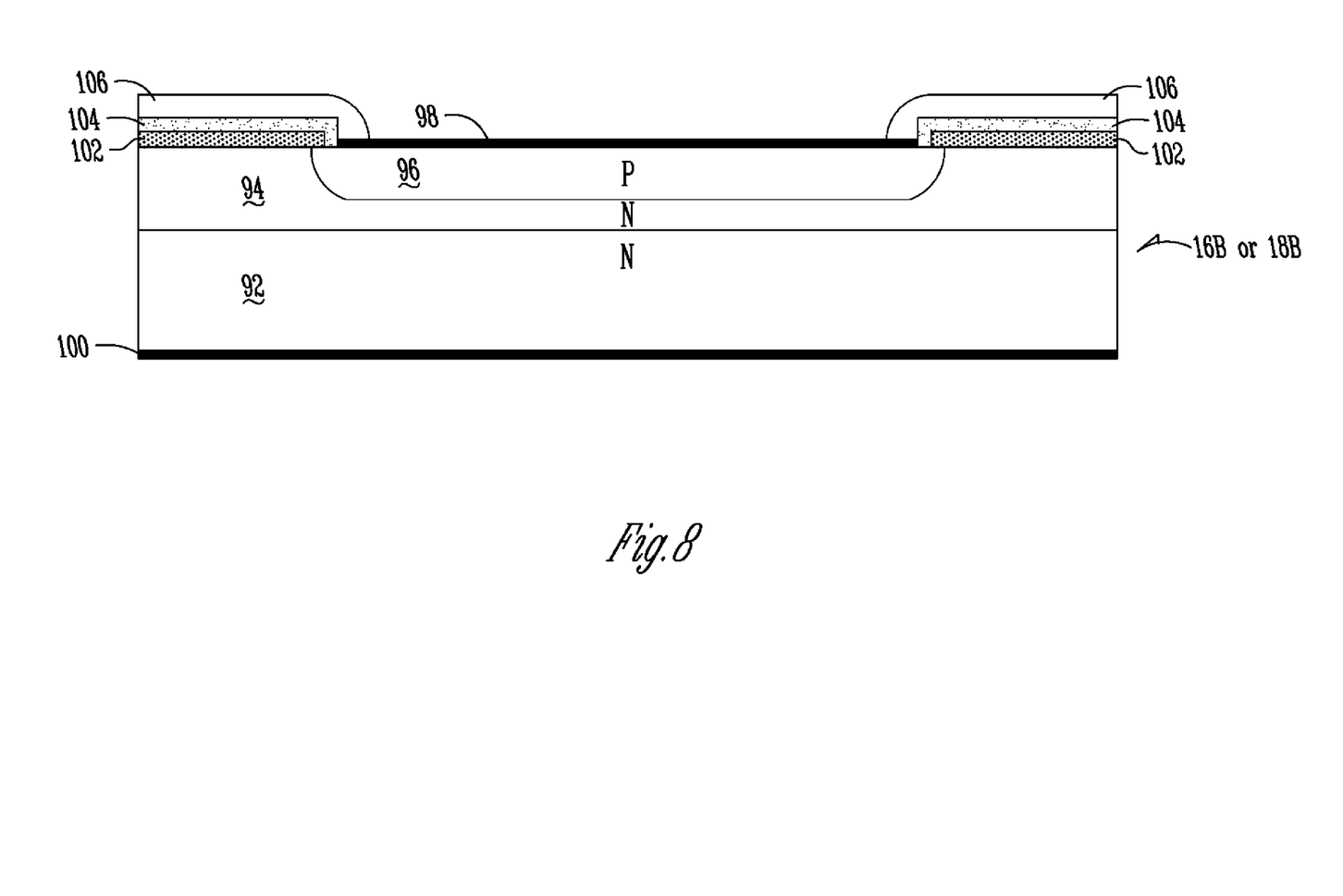
FIG. 8 is a greatly enlarged in scale side view of a modified semiconductor die or chip that can be used in a third embodiment according to the present invention, or with the first and second embodiments.

Reference numbers 92, 94, 96, 102, and 104 in FIG. 8 illustrate an example of one form of a conventional PFC diode semiconductor die that can be used with Embodiment 50 (reference numbers 98, 100 and 106 illustrate modifications according to an optional embodiment of the invention that can be made to the conventional die 92/94196/102/104, as will be discussed later. As can be seen in FIG. 8, without the modifications of layer 98 and 106, there is an area of exposed P type semiconductor material on the P-side of die 18. In this type of die, the exposed area of P type material is a fraction of the total area of the top of die 18. There is area on the top of the P side in generally that same plane as the exposed surface or area of P type material but which is above the N type material 94. This area is termed inactive, however, because it is treated with passivation layers 102 and 104, according to methods and materials known in the art.

To improve performance of this type of die 18 when mounted P side down, groove 69 in exemplary embodiment one is designed to remove material from lead frame surface 31 that otherwise would tend to come into abutment with the non-active area(s) at 102/104 on the top of die 18 surrounding the exposed P type semiconductor material. Essentially groove 69 defines a die mounting pad 68 that has a shape and area which approximately matches the shape and area of exposed P type material on the P side of die 18. When the exposed area of P type material on the P side of die 18 is brought into correspondence with pad 68, the non-active areas defines by 102/104 of die 18 do not abut the surface 31 of lead frame 30 (see FIG. 4B). A gap between the bottom of the V-shaped groove 69 and the non-active surface(s) 104 is maintained.

As can be appreciated by those of skill in the art, the precise shape and dimensions of the die mounting pad 68 would be coordinated with the precise shape and dimensions of the area of exposed P type semiconductor material on the P side of die 18. Additionally, the precise shape, depth, and width of groove 69 would be coordinated with the precise shape and dimensions of the exposed P type material on the P side of die 18. In embodiment 50 of FIGS. 3A-C, groove 69 is V-shaped, with a medial wall substantially perpendicular to the top surface of die mounting pad 68 and a bottom wall that angles from the bottom of the medial wall laterally and upwardly to surface 31 of lead frame 30. This can provide some tolerance for some variation in shape and area of the exposed P type material or in placement of die 18 on die mounting pad 68. Die mounting pad 68 essentially presents an "island" or mounting location/locator on lead frame 30 for die 18, and promotes direct electrical communication between the exposed area of P type material on the P side of die 18 and the electrically conductive lead frame 30 and deters or limits direct electrical communication between non-active area(s) and electrically conductive lead frame 30.

Another groove, reference number 67, can optionally be formed in lead frame surface 31 to produce an island or mounting location 66 for the other semi-conductor die 16 (in this example for the N side of die 16). As can be seen, in this embodiment die mounting pad or location 66 is larger than mounting pad 68 as its area and shape is coordinated with the area and shape of the exposed N type semiconductor material on the N side of die 16. As can further be appreciated, if a die like die 16 is used, it does not have any non-active area. Therefore, groove 67 does not have to be as wide as groove 69. It is to be understood that groove 67 does not necessarily need to be used. It does form a locator for the N side of die 16 and can help confine and position die 16 on surface 31.

In this embodiment die 16 and die 18 are identical and are in the form of the combination 92/94/96/102/104 of FIG. 8 (but without the covering 106). Other configurations for either die 16 or die 18 can be used with correlated size and shape for groove 69 and/or groove 67.

Figure 4A:
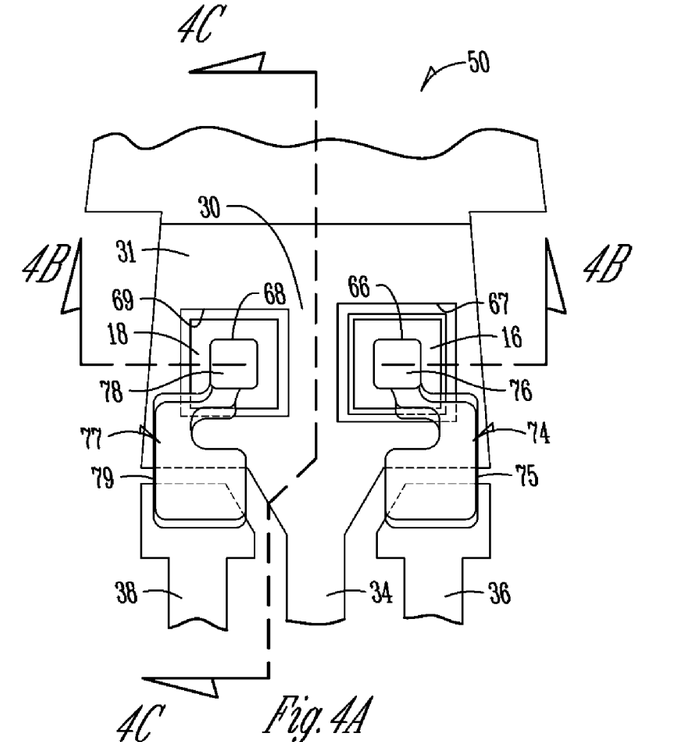
FIG. 4A is an enlarged partial top plan view of an assembled two PFC diode package on the modified lead frame of FIGS. 3A-C according to the first exemplary embodiment of the present invention.
Figure 4B:
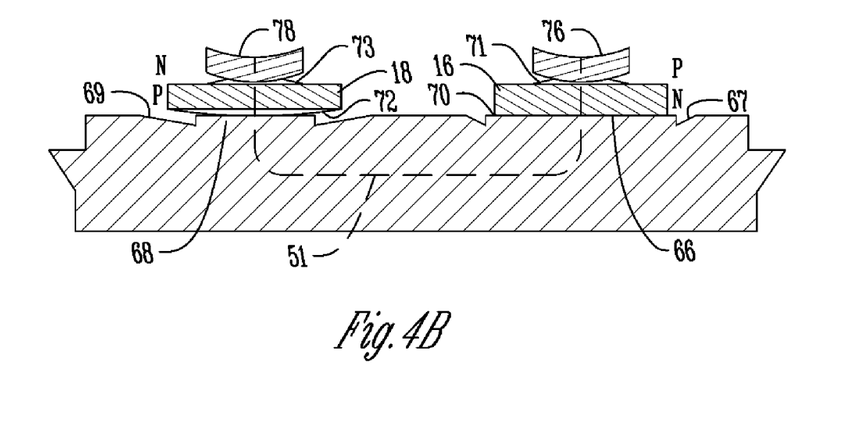
FIG. 4B is a still further enlarged sectional view taken along lines 4B-4B of FIG. 4A.
Figure 4C:
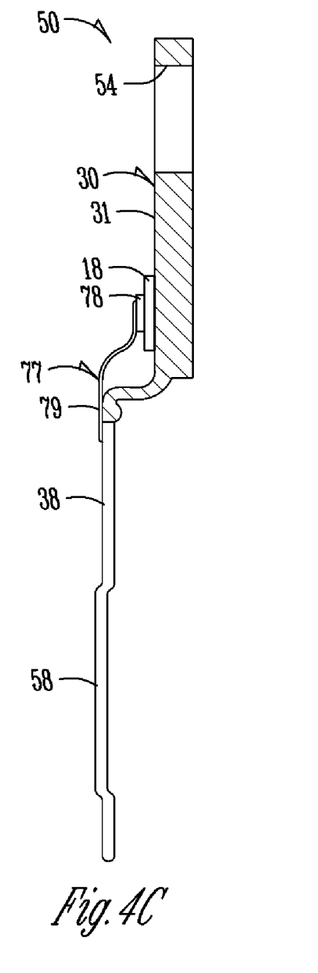
FIG. 4C is a reduced-in-size side view of the embodiment of FIGS. 4A and B.
Figure 5A:
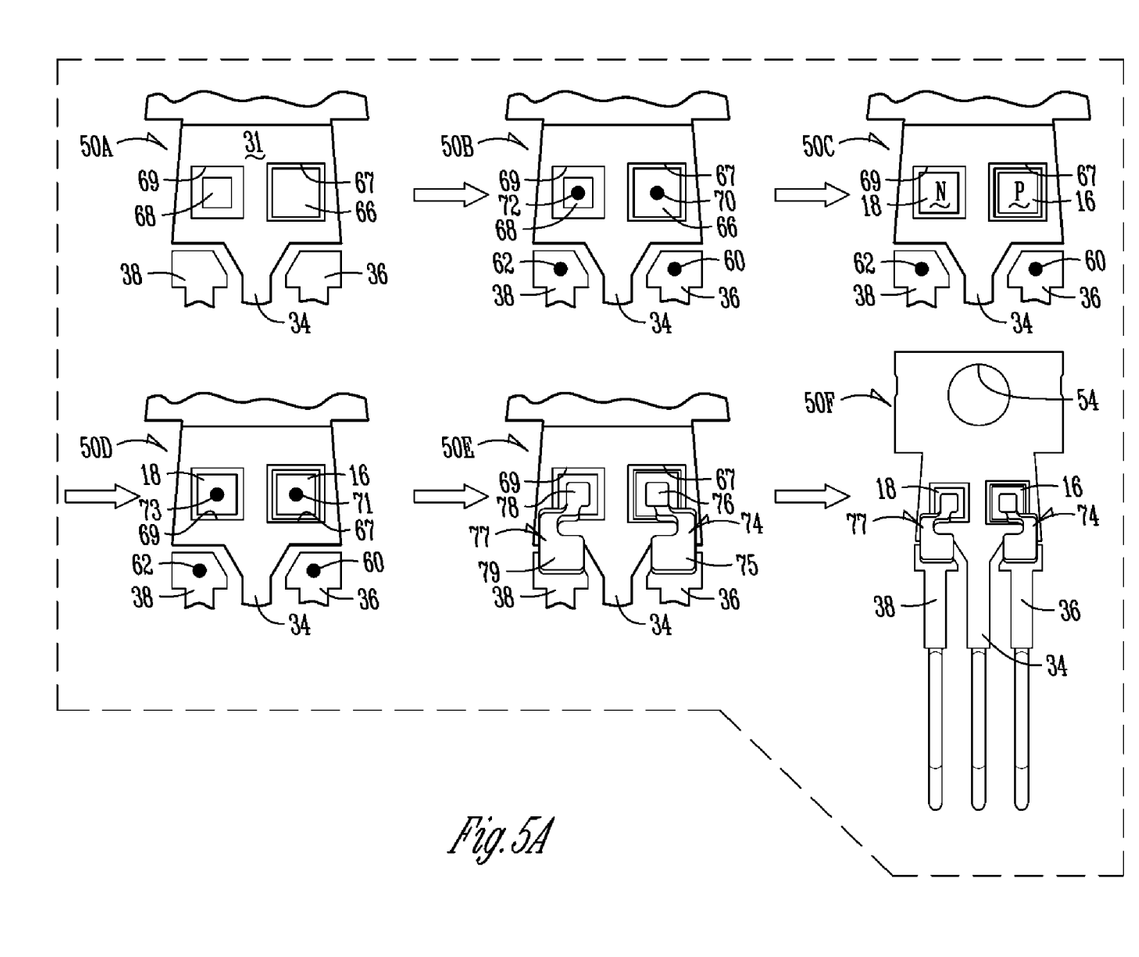
FIG. 5A is a diagrammatic view of manufacturing steps to produce the PFC tandem diode assembly of the first exemplary embodiment of FIGS. 4A-C.

FIGS. 4A-C show die 16 and die 18 in position on lead frame 30 at their die mounting pads 66 and 68 respectively (after placing appropriate conventional solder paste 70 and 72 on pads 66 and 68—see FIGS. 4B and 5A). In this example, die 16 and die 18 are both PFC diodes; however diode 18 is mounted P-side down (and N side up). In contrast, diode 16 is mounted with appropriate solder 70 but in the conventional P-side up (N side down) orientation. As diagrammatically illustrated at FIG. 4B with dashed line 51, this mounting arrangement utilizes the electrical conductivity of lead frame 30 to provide a series connection between the P side of chip 18 and the N side of chip 16. No additional conductors are needed. For example, no separate wire bonding is needed to series-connect those sides of the two diodes.

All that is then required for final electrical connection is that conductors 74 and 77 be operatively connected between lead 36 and the P side of die 16 (the side which is up), and lead 38 and the N side of die 18 (the side which is up). In this example, a mass production bridge frame is used to clip-bond leads 36 and 38 to the tops of die 16 and die 18 respectively by electrically conductive bars, tabs, or clips. Conductors 74 and 77 can be connected at ends 75 and 79 to leads 36 and 38, respectively, and connected at opposite ends 76 and 78 to the tops of the mounted chips 16 and 18, respectively.

Figure 5B:
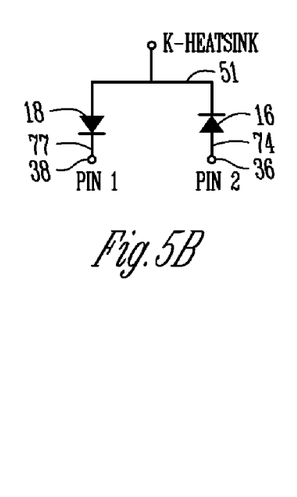
FIG. 5B is an electrical circuit diagram of the package of FIG. 5A.

The key is that by flipping or inverting chip 18 and utilizing the electrically conductive nature of lead frame 30, a single, simple electrical connection (bridge frame clip bonding with conducting members 74 and 77) completes the series connection of tandem power diodes with leads 36 and 38 of lead frame 30, as shown in the electrical diagram of FIG. 5B.

It is noted that lead 34 is conventional in some lead frames and may not be needed for some assemblies or applications. Also, the lead frame paddle can conventionally include an aperture 54 at its end opposite leads 34, 36 and 38 and is adapted for connection by conventional means to a heat sink (see schematic representation in FIG. 5B) to move heat away from the chips and lead frame during operation.

As can be seen, the exemplary embodiment 50 has fewer components and involves fewer manufacturing steps than the state of the art package of FIGS. 1A-C and 2A-B. It eliminates the ceramic isolation board, copper pads, and the three electrical wire bond connections, as well as the corresponding assembly steps for them, with prior art package 10 of FIGS. 2A-B.

FIG. 5A illustrates in a flow-chart-type diagram additional details regarding a manufacturing and assembly process for a package 50 of FIGS. 3A-C and 4A-C:

a) Lead frame 30 is pre-manufactured with specially configured grooves 67 and 69 in its surface 31 (see reference numeral 50A).

b) Conventional solder paste 60 and 62 is dispensed by conventional methods on leads 36 and 38, and conventional solder paste 70 and 72 is also dispensed by conventional methods on die mounting pads 66 and 68, as illustrated at reference number 50B.

c) Chip 16 is conventionally mounted P side up (N side down) on die mounting pad 66, but chip 18 is flipped and mounted P side down (N side up) to the die mounting pad 68 (reference numeral 50C).

d) Conventional solder paste 71 and 73 is added to the tops of chips 16 and 18 (see reference 50D).

e) A bridge frame with clip or bar conductors 74 and 77 is then brought down so that conductors 74 and 77 extend between the tops of chips 16 and 18 and leads 36 and 38 (reference numerals 50E and 50F).

f) Conventional final package assembly, packaging, and finishing create the final package.

As can be appreciated, the assembly method of FIG. 5A utilizes substantially conventional lead frame electronics packaging steps. Lead frame 30 is conventional except for the pre-modification of surface 31 (e.g. groove 69). Chips 16 and 18 are conventional except chip 18 is inverted relative to chip 16. However, components and steps are avoided by the method of FIG. 5A. Isolation boards and separate copper die mounting pads are not needed. Three wire bonding connections are not needed. Instead, a conventional two conductor clip bonding, wire bonding, or other conventional electrical connection can be made between leads 36 and 38 and the two die 16 and 18. A third electrical connection between dies is not needed.

FIG. 5B shows the electrical circuit diagram for the completed package 50 of this exemplary embodiment. The two power package diodes 16 and 18 are connected in series between leads 36 and 38. Note how the method of FIG. 5A reduces the number of mounting and attachment steps of the additional components needed by the state of the art method of FIG. 2A. Therefore, the method of FIG. 5A promotes less expensive manufacturing. It also promotes good electrical properties and performance with this tandem set of diodes.

The assembly method of FIG. 5A lends itself to efficient semiconductor device fabrication. For example, existing automated assembly machines can be used for the steps with few changes to the lead frame and assembly process. This results in lower cost and investment in parts and assembly. The major differences are (a) the use of the modified lead frames (e.g. with groove 69 for each chip 18) and (b) that chip 18 must be flipped upside down when mounted on die mounting pad 68. This can be achieved by programming the following steps into a conventional automated chip fabrication machine: (a) pick chip 18 up with P side up from a wafer; (b) reverse or flip the chip, and (c) place the inverted chip (P side down) onto its die mounting pad 68 on lead frame 30.

In this example, diodes 16 and 18 from a tandem power rectifier circuit package (e.g. 8 Amp, 600 Volt) which can be fabricated following TO-220 or ITO-220 electronics packaging specifications and conventional automated packaging procedures. It is heat sinkable to handle relatively high power applications. It typically has three leads. However, other electronics packaging specifications or methods can utilize the concepts of described above for tandem power rectifiers or for other die or chips.

C. Exemplary Embodiment Two

Illustrated at FIGS. 6A-C, and 7A-C

The second embodiment 80 is quite similar to the first embodiment 50 described above except for the following principle differences.

Figure 6A:
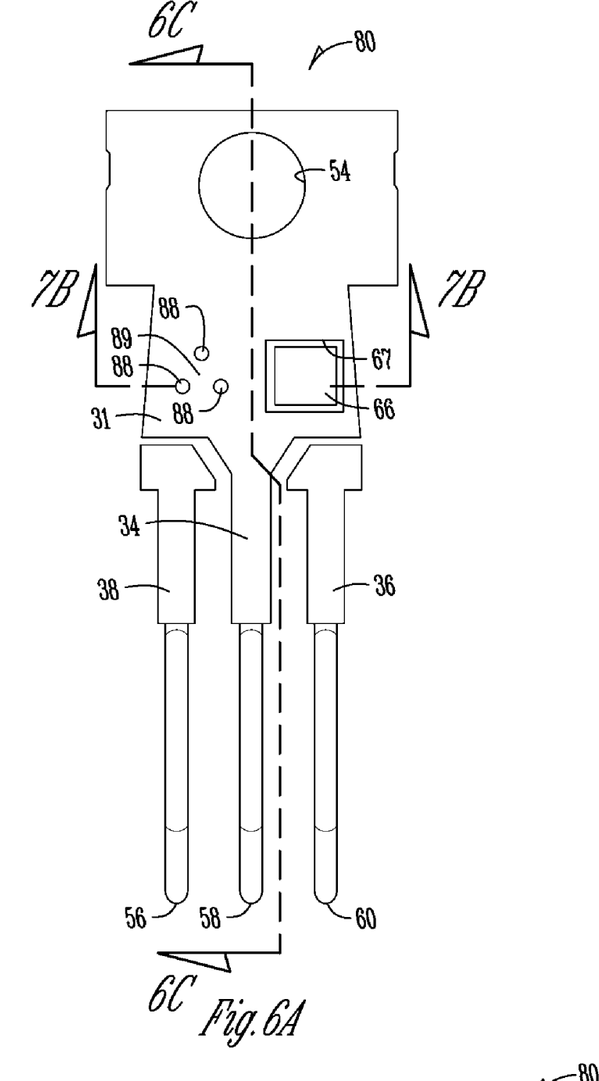
FIG. 6A is similar to FIG. 3A but illustrates a modified lead frame according to a second exemplary embodiment of the present invention.
Figure 6B:
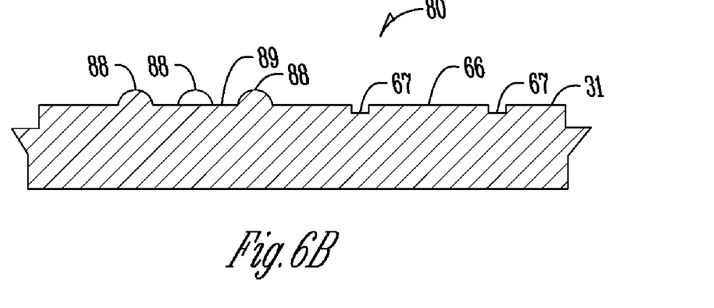
FIG. 6B is an enlarged sectional view taken along lines 6B-6B of FIG. 6A.
Figure 6C:
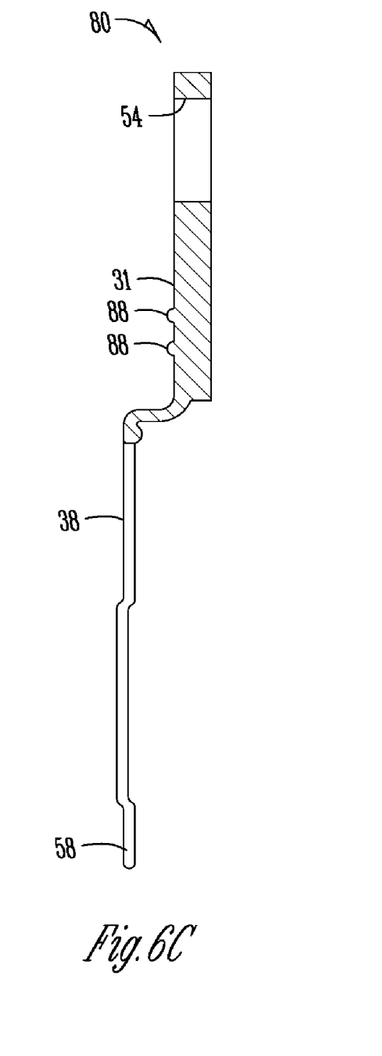
FIG. 6C is a reduced-in-size side sectional view taken along line 6C-6C of FIG. 6A.

As shown at FIGS. 6A-C, instead of a groove 69 defining a mounting island or pad 68 for the P-side of chip 18 on lead frame 30, three raised bosses or bumps 88, arranged in an equilateral triangle, are formed in surface 31 of conventional lead frame 30. Bosses 88 are arranged to provide a mounting locator and positioning structure on lead frame 30 for the exposed P type semiconductor material of the P side of chip 18. They spaced apart a distance to provide a stable three-point mount for chip 18 but the apex of each boss 88 also comes into direct abutment with the exposed P type semiconductor material on the P side of chip 18. But further, the three bosses 88 are spaced closely enough to one another so that when chip 18 is correctly placed on them, none of them come into abutment with the non-active area of the P side of the chip. Also, by spacing the three bosses 88 out slightly, solder paste can be dispensed in the middle of them to further promote good electrical connection with the exposed P type material.

On the other hand, the raised bosses 88 hold the exposed non-active surface of the P side of chip 18 away from surface 31 of lead frame 30. This promotes better electrical performance of the circuit.

It should be appreciated that instead of three raised bumps or bosses 88, there could four or more. Instead of bumps, the raised portion from surface 31 could be a circle, square, or other shape to hold the chip above the remainder of surface 31 to provide an air gap between the non-active area of the P side of the chip and surface 31. The raised shape could have a lower middle portion (like the area between three raised bosses 88). Alternatively, it could be solid in cross-section (like mounting pad 68).

The other semi-conductor device 16 in embodiment 80 can be placed on mounting pad 66 surrounded by groove 67, as with the first embodiment of FIGS. 4A-C. Alternatively there may be some other mounting arrangement, including without any modification or variation on surface 31.

Thus, series connection between the P side of chip 18 and the N side of chip 16 is achieved by placing those sides into electrical communication with surface 31 of electrically conductive lead frame 31 and utilizing the electrical conductivity of lead frame 30 instead of a separate wire bond or other part or assembly step.

Figure 7A:
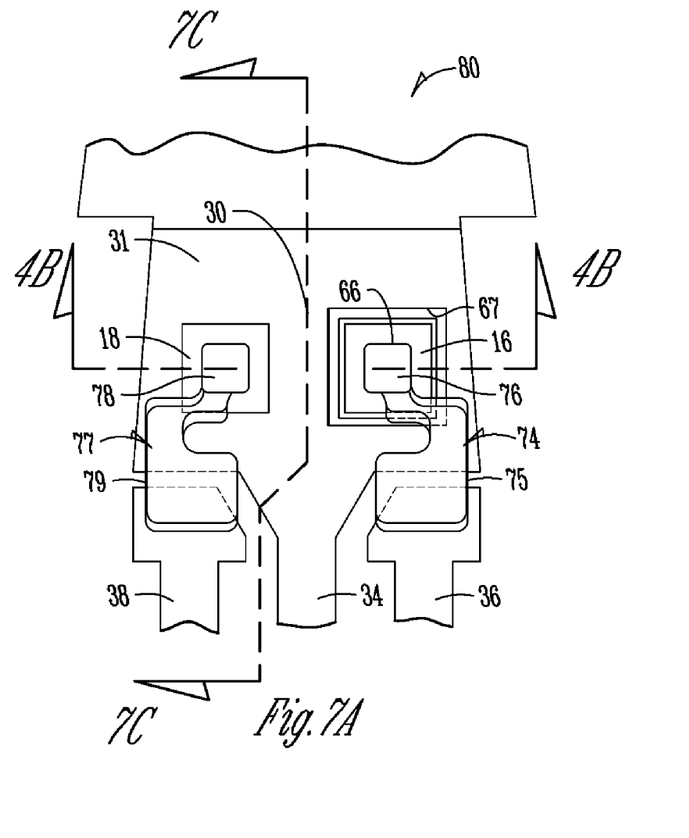
FIG. 7A is an enlarged partial top plan view of an assembled two PFC semiconductor diode package using the lead frame of FIGS. 6A-C according to the second exemplary embodiment.
Figure 7B:
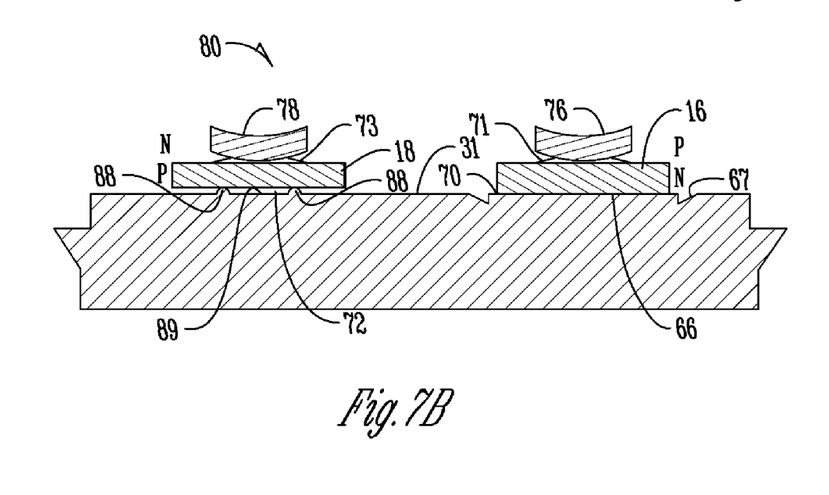
FIG. 7B is a further enlarged sectional view taken along line 7B-7B of FIG. 7A.
Figure 7C:
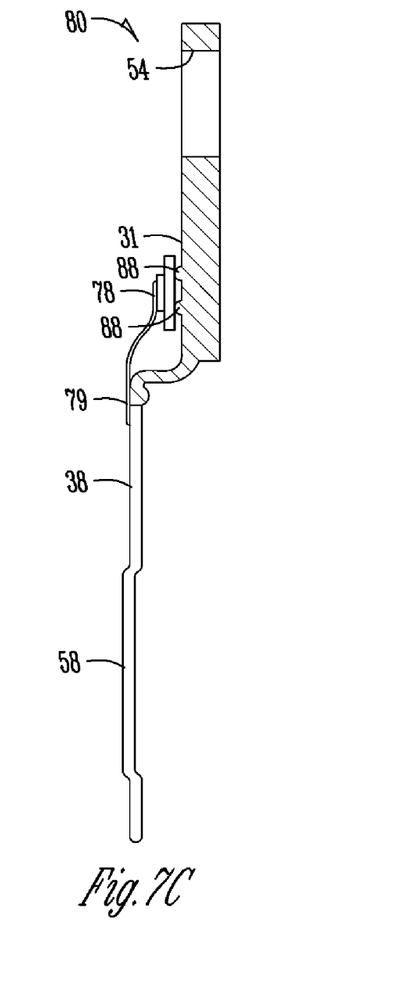
FIG. 7C is a reduced-in-size side view of the embodiment of FIGS. 7A and B.

FIGS. 7A-C illustrate the mounting of diodes 16 and 18 to the lead frame of FIGS. 6A-C. Like embodiment one of FIGS. 5A-C, chips 16 and 18 of embodiment two are then electrically connected to leads 36 and 38 by clip bonding. Alternatively, it could be by wire bonding or other methods. But only two added electrical conductors are needed to complete the series connection of the two chips to the two leads 36 and 38. As indicated in FIG. 7B, chip 18 is inverted or flipped so it has P-side down and the raised bosses 88 (a) promote electrical communication between the P semiconductor material of chip 18 and lead frame 30, and (b) deter electrical communication between the non-active area of the P side of chip 18 and lead frame 30.

D. Exemplary Embodiment Three

FIGS. 8 and 9A-C

FIGS. 8 and 9A-C illustrate a still further exemplary embodiment according to the present invention.

FIG. 8 illustrates a modified semi-conductor diode die. It begins with a conventional solid state diode 16 or 18 which has an exposed area of N type semiconductor material 92 on its N-side and an exposed area of P type semiconductor material 96 on its P-side. It also has a non-active area or areas covered or treated with passivation layers 102 and 104 on the P side.

As shown in the embodiment of FIG. 8, first passivation layer 102 completely covers the non-active exposed surface and extends somewhat over the margin of the exposed P material 96, and second passivation layer 104 covers the first passivation layer 102. Layer 104 also covers the inner facing edges of material 102 down to the P material 96. Alternatively, there might be just one passivation layer or more than two. The passivation layer(s) terminate(s) bonds on the semiconductor surface to promote chemical stability of the surface; in other words, to render the semiconductor surface chemically "passive" (e.g., hydrogen termination of bonds on a silicon surface will prevent oxidation of the surface; oxidation of Si surface bonds will also passivate the surface). A variety of methods of semiconductor surface passivation exist and are well known in the art.

In exemplary embodiments one and two described above, the non-active area(s) on the P side of this style of chip is/are isolated from surface 31 of lead frame 30 when die 18 is mounted P side down on lead frame 30 by either (a) removing material from surface 31 (e.g. forming groove 69) under the non-active area (FIG. 4B) or (b) holding the non-active area above surface 31 (e.g. forming raised bosses or bumps 88 on surface 31). In this third exemplary embodiment, instead of modifying surface 31 of lead frame 30, a cover 106 is added over the outer passivation layer 104 on the P-side to create a modified semiconductor die 16B or 18B as shown in FIG. 8. Cover 106 is non-electrically conductive and, in this embodiment, is relatively smooth and flat.

Therefore, die 16B or 18B can be mounted and supported P side down directly onto a flat surface 31 of lead frame 30. Electrically isolating cover 106 would provide a stable mount for the die on surface 31, but the non-active area of the P side would be further electrically isolated from surface 31. Solder paste or some other conducting material can be placed between the exposed P type semiconductor material of die 18B and surface 31 to effectuate a good electrical connection between surface 31 and the P type material.

Cover 106 can take different forms. In the example of FIG. 8 it is illustrated as a single layer. The types of materials that could be used for cover 106, and the methods to apply cover 106, are well known to those skilled in the art.

Additionally, this third embodiment die 16B or 18B also has been modified to include an electrically conductive, thin metallization layer 98 mounted or deposited by conventional methods over the exposed P material 96 before placement of covering layer 106. Furthermore, an electrically conductive metallization layer 100 can be deposited on the bottom side of device 16B or 18B.

The combination of adding cover 106 and metallization layers 98 and 100 promotes improved switching performance of semiconductor device 16B or 18B. It better electrically isolates the non-active surface on top of the device. The highly conductive metallization layers 98 and 100 improve electrical connection and communication of both the P material on the P-side and N material on the N-side of device 16B or 18B.

Figure 9A:
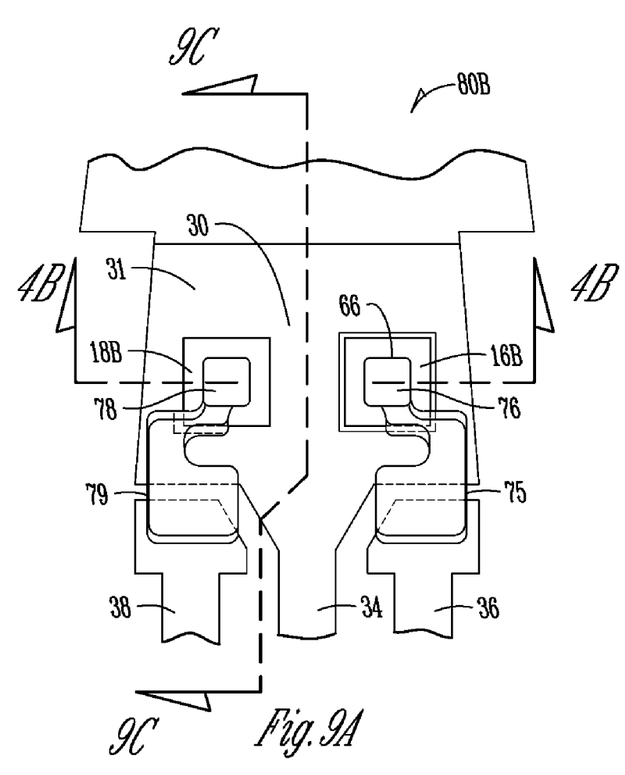
FIG. 9A is a top plan view of a lead frame with a pair of semiconductor chips of FIG. 8 mounted to it; one P-side down, one P-side up according to a third exemplary embodiment of the invention.
Figure 9B:
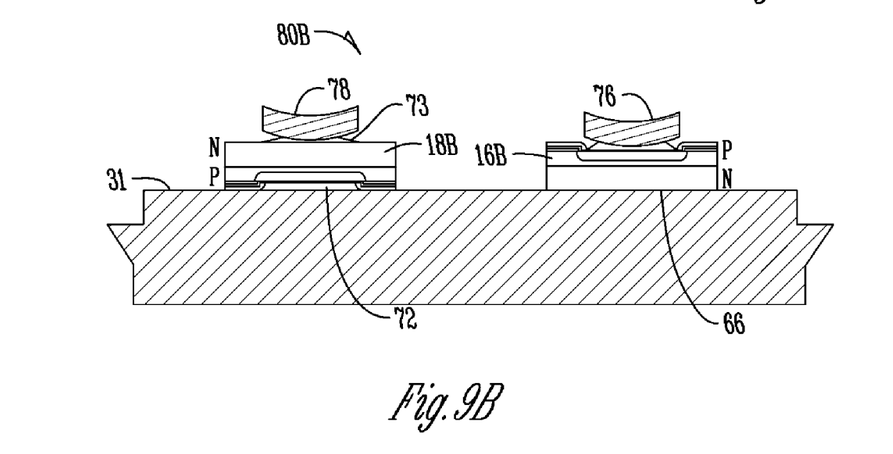
FIG. 9B is an enlarged sectional view along line 9B-9B of FIG. 9A.
Figure 9C:
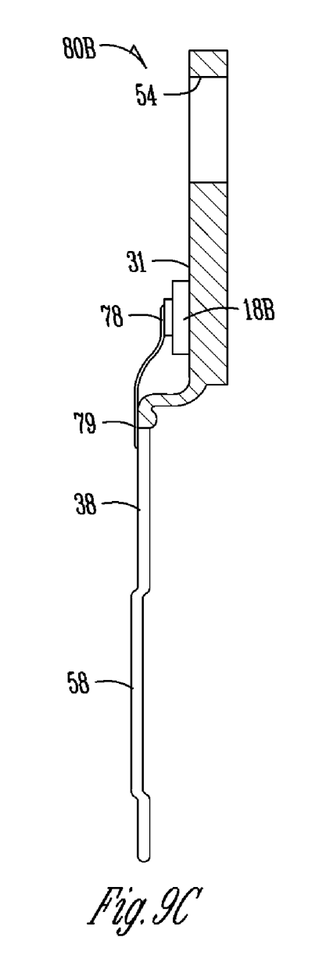
FIG. 9C is a reduced-in-size side view of the embodiment of FIGS. 9A and 9B.

FIGS. 9A-C show utilization of devices 16B and 18B in a two diode power package 80B. Like embodiments one and two, die 18B is inverted to P side down while die 16B is P side up so that series connection between the two die 16B and 18B is via the electrical contact with and electrical conductivity of lead frame 30.

Note that the modified die 18B of this third embodiment could be used without any modification to mounting surface 31 of lead frame 30 (e.g., it does not need groove 69 or bosses 88 or other formed locating structure). As illustrated in FIG. 9B, by electrically isolating the non-active area(s) of the P-side of device 18B with cover 106, die 18B can be flipped and mounted in direct abutment to a flat surface 31 of lead frame 30. Metallization layer 98 helps conductivity and switching performance. Additionally, deposition layer 100 assists electrical conductivity and switching performance.

As illustrated in FIGS. 9A-C, the final step of forming the series connection is bridge frame clip bonding connections 74 and 77 between the top of each die 16B and 18B and its corresponding lead 36 or 38.

It can therefore be seen that the modification of the die in this third embodiment, by the addition of the isolating cover 106, is an alternative way to allow the ability to mount a die in an inverted P-side-down orientation on a lead frame. It is an alternative way to allow a series connection with a P-side-up die mounted on the same lead frame by using the conductivity of the lead frame as an electrical connection. Like embodiments one and two, this third embodiment eliminates the isolation board, separate copper mounting pads, and three wire bonds of the state of the art package of FIGS. 1A-C.

While is does require modification of the die, this can be done efficiently when mass producing a plurality of the die by conventional processes (e.g. chip fabrication processes and thin film or layer deposition techniques). Also, while this requires modification of the die, it does not require modification of the lead frame.

However, it is to be understood that inverted die 18B could also be used with either embodiment one or embodiment two. It could be mounted P side down on either (a) a mounting pad like pad 68 with the non-active area covered by cover 106 spaced from lead frame surface 31 by a groove like groove 69 of FIGS. 4A-C, or (b) raised structure like bosses 88 with the non-active area covered by cover 106 held above surface 31 like FIGS. 7A-C. This could further improve electrical isolation of the non-active area of the P side of die 18B and the lead frame. This could promote improved switching capability of device 18B. It can also promote good performance at high voltage and power levels such as with a high voltage power package rectifier, as one example.

E. Options and Alternatives

It can therefore be seen that the exemplary embodiments address the problems and deficiencies in the state of the art. It is to be understood that the above described embodiments are but a few examples of the different forms and aspects the invention can take. The invention is not limited to the above-described exemplary embodiments. Variations obvious to those skilled in the art will be included within the invention, which is defined solely by the appended claims.

For example, types of materials, proportions, and specific configurations of mounting of the die to lead frame surface 31 can vary, as can how non-active area(s) could be covered.

As previously stated, the examples relate to a series connection tandem PFC diode package. Other electrical or electronic components requiring series connection could be assembled in analogous ways.

What is claimed is:

1. An electronics package assembly comprising:
    an electrically conductive lead frame having electrically isolated first and second leads and a die mounting surface;
    a first semiconductor die comprising a P side and an N side, the P side of the first die mounted at the die mounting surface with P junction material in electrical communication with the die mounting surface;
    a second semiconductor die comprising a P side and an N side, the N side of the second die mounted at the die mounting surface with N junction material in electrical communication with the die mounting surface;
    a first electrical conductor in operative electrical communication between the N side of the first die and a first lead of the lead frame;
    a second electrical conductor in operative electrical communication between the P side of the second die and a second lead of the lead frame; and
    a mounting pad formed in the die mounting surface, the mounting pad being electrically coupled to a central portion of one of the first or second semiconductor dies via an electrically conductive material, the mounting pad and the electrically conductive material being configured to provide a gap between the die mounting surface and a peripheral portion of the semiconductor die so that the first and second semiconductors dies are connected in series to one another through the lead frame and to the first and second leads through the first and second electrical conductors.

2. The assembly of claim 1 further comprising a packaging material around the first and second semiconductors and part of the lead frame.

3. The assembly of claim 1 wherein the semiconductors comprise power factor correction diodes.

4. The assembly of claim 1 in combination with an electrical or electronic circuit.

5. The combination of claim 4 further comprising a heat sink operatively connected to the lead frame.

6. The combination of claim 4 wherein the electrical or electronic circuit is in operative connection with an electrical or electronic device.

7. The assembly of claim 1 wherein the mounting pad is electrically coupled to a central portion of the first die.

8. The assembly of claim 1 wherein the mounting pad has a central portion surrounded by a recess formed in the lead frame.

9. The assembly of claim 8 wherein the P side of the first die comprises an exposed surface of P type semiconductor material having an area and shape and an exposed non-active surface having an area and shape, and the die mounting pad for the first die comprises an area and shape correlated to the area and shape of the exposed surface of P type semiconductor material, the recess comprising an area and shape correlated to the area and shape of the exposed non-active surface, to facilitate electrical communication of the P type semiconductor material with the lead frame and electrical isolation of the non-active surface with the lead frame.

10. The assembly of claim 1 wherein the mounting pad comprising one or more bosses extending above the surface of the lead frame.

11. The assembly of claim 10 wherein the P side of the first die comprises an exposed surface of P type semiconductor material having an area and shape and an exposed non-active surface having an area and shape, and the die mounting pad for the first die comprises an area and shape correlated to the area and shape of the exposed surface of P type semiconductor material, and is configured to hold the exposed non-active surface away from the surface of the lead frame to facilitate electrical communication of the P junction material with the lead frame and electrical isolation of the non-active surface with the lead frame.

12. The assembly of claim 1 wherein the first and second electrical conductors comprise one of a wire bond or clip bond.

13. The assembly of claim 1 wherein the P side of the first die comprises an exposed surface of P type semiconductor material having an area and shape and an exposed non-active surface having an area and shape, and further comprising an electrically isolating cover over the exposed non-active surface.

14. The assembly of claim 13 wherein the exposed non-active surface comprises one or more passivation layers over an N type semiconductor material.

15. The assembly of claim 14 further comprising a metallization layer over at least one of the exposed P type semiconductor material on the P side of the die.

16. A method of connecting first and second semiconductor devices, each having a P-side and an N-side, in electrical series in an electronics package comprising:
    providing an electrically conductive substrate and two electrically conductive leads;

mounting the first device P side down on the substrate with P type semiconductor material in electrical communication with the die mounting surface and the second device P side up on the substrate with N type semiconductor material in electrical communication with the die mounting surface to create a series connection between P and N sides of the first and second devices;

electrically connecting the N side of the first device of the leads and the P-side of the second device to the other of the leads for series connection of the leads to the devices; and forming a mounting pad in the die mounting surface and applying an electrically conductive material to the mounting pad, the mounting pad being electrically coupled to a central portion of one of the first or second semiconductor dies via the electrically conductive material, the mounting pad and the electrically conductive material being configured to provide a gap between the die mounting surface and the semiconductor die.

17. The method of claim 16 wherein the mounting pad comprises a central portion surrounded by a recess or groove.

18. The method of claim 16 wherein the mounting pad comprises one or more raised bosses.

19. The method of claim 16 wherein the P side of the first device comprises an exposed surface of P type semiconductor material having an area and shape and an exposed non-active surface having an area and shape, and further comprising an electrically isolating cover over the exposed non-active surface.

20. A method of assembling an electronics package including two semiconductor dies in series connection on an electrically conductive lead frame comprising:

forming a mounting pad in a die mounting surface of the electrically conductive lead frame and applying an electrically conductive material to the mounting pad, the mounting pad being electrically coupled to a central portion of one semiconductor die via the electrically conductive material, the mounting pad and the electrically conductive material being configured to provide a gap between the die mounting surface and a peripheral portion of the semiconductor die;

soldering each semiconductor die in electrical communication to the die mounting surface, one P side down, the other P side up, using the electrical conductivity of the die mounting surface to electrically communication the P side of one die to the N side of the other die;

soldering an electrical connection between the N side of the one semiconductor die and a lead of the lead frame and the P side of the other semiconductor die to another lead of the lead frame.

21. The method of claim 20 wherein the P side of the one semiconductor die comprises an exposed surface of P type semiconductor material having an area and shape and an exposed non-active surface having an area and shape, and further comprising forming the mounting pad to isolate the non-active area from the lead frame when the one semiconductor die is mounted to the mounting pad by spacing the lead frame from the non-active area.

22. The method of claim 20 wherein the P side of the one semiconductor die comprises an exposed surface of P type semiconductor material having an area and shape and an exposed non-active surface having an area and shape, and further comprising adding an electrically isolating cover over the exposed non-active surface.

23. A high voltage rectifier electronics package assembly comprising:

an electrically conductive lead frame having electrically isolated first and second leads and a die mounting surface;

a first power factor correction diode semiconductor die comprising a P side having exposed P type semiconductor material and exposed non-active material, and an N side having exposed N type semiconductor material, the P side of the first die mounted at the die mounting surface with the exposed P type semiconductor material in electrical communication with the die mounting surface and the exposed non-active material in electrical isolation from the die mounting surface;

a second power factor correction diode semiconductor die comprising a P side and an N side, the N side of the second die mounted at the die mounting surface with N type semiconductor material in electrical communication with the die mounting surface;

a first electrical conductor in operative electrical communication between the N side of the first power factor correction diode and a first lead of the lead frame; and a second electrical conductor in operative electrical communication between the P side of the second power factor correction diode and a second lead of the lead frame; and a mounting pad formed in the die mounting surface, the mounting pad being electrically coupled to a central portion of the first power factor correction diode via an electrically conductive material, the mounting pad and the electrically conductive material being configured to provide a gap between the die mounting surface and a peripheral portion of the first power factor correction diode so that the power factor correction diodes are connected in series to one another through the lead frame and to the first and second leads through the first and second electrical conductors, and the non-active material on the P side of the first power correction diode is electrically isolated from the lead frame.

24. The assembly of claim 1 wherein the mounting pad is electrically coupled to a central portion of the second die.

* * * * *